US010553520B2

(12) United States Patent
Iizuka et al.

(10) Patent No.: US 10,553,520 B2
(45) Date of Patent: Feb. 4, 2020

(54) ELECTRONIC APPARATUS

(71) Applicant: Sony Interactive Entertainment Inc., Tokyo (JP)

(72) Inventors: Hitomi Iizuka, Tokyo (JP); Hiroaki Tsurumi, Tokyo (JP); Shinya Tsuchida, Tokyo (JP); Kenji Hirose, Tokyo (JP); Yuta Tamaki, Chiba (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 15/559,111

(22) PCT Filed: Apr. 4, 2016

(86) PCT No.: PCT/JP2016/061034
§ 371 (c)(1),
(2) Date: Sep. 18, 2017

(87) PCT Pub. No.: WO2016/159382
PCT Pub. Date: Oct. 6, 2016

(65) Prior Publication Data
US 2018/0247881 A1  Aug. 30, 2018

(30) Foreign Application Priority Data

Apr. 3, 2015 (JP) .................................. 2015-077167

(51) Int. Cl.
*H01L 23/00* (2006.01)
*H01L 23/40* (2006.01)
(Continued)

(52) U.S. Cl.
CPC .......... *H01L 23/4006* (2013.01); *A63F 13/90* (2014.09); *H01L 23/433* (2013.01);
(Continued)

(58) Field of Classification Search
CPC ............... H01L 23/4006; H01L 23/433; H01L 2023/405; H01L 2023/4031;
(Continued)

(56) References Cited

U.S. PATENT DOCUMENTS 6,049,469 A * 4/2000 Hood, III ................ G06F 1/182
174/388
6,282,093 B1   8/2001 Goodwin
(Continued)

FOREIGN PATENT DOCUMENTS

JP     7042515 U    8/1995
JP   2001060778 A   3/2001
(Continued)

OTHER PUBLICATIONS

International Search Report for corresponding PCT Application No. PCT/JP2016/061034, 4 pages, dated May 17, 2016.
(Continued)

*Primary Examiner* — Mukundbhai G Patel
*Assistant Examiner* — Zhengfu J Feng
(74) *Attorney, Agent, or Firm* — Matthew B. Dernier, Esq.

(57) ABSTRACT

A leaf spring is disposed between a circuit board and a upper shield. The leaf spring biases a heat sink toward the circuit board through a connecting member. The leaf spring is not electrically connected to the upper shield. According to this structure, an integrated circuit and the heat sink can be contacted with each other with certainty. Further, generation of unnecessary radiation can be suppressed effectively.

13 Claims, 8 Drawing Sheets

(51) Int. Cl.
  *A63F 13/90* (2014.01)
  *H01L 23/433* (2006.01)
  *H05K 1/02* (2006.01)
  *H05K 1/18* (2006.01)
  *H05K 9/00* (2006.01)

(52) U.S. Cl.
  CPC ........... *H05K 1/0203* (2013.01); *H05K 1/181* (2013.01); *H05K 9/0033* (2013.01); *H01L 2023/405* (2013.01); *H01L 2023/4031* (2013.01); *H01L 2023/4037* (2013.01); *H01L 2023/4062* (2013.01); *H01L 2023/4068* (2013.01); *H01L 2023/4087* (2013.01); *H05K 2201/066* (2013.01); *H05K 2201/09072* (2013.01); *H05K 2201/10265* (2013.01); *H05K 2201/10371* (2013.01); *H05K 2201/10409* (2013.01)

(58) Field of Classification Search
  CPC ..... H01L 2023/4037; H01L 2023/4062; H01L 2023/4068; H01L 2023/4087; H05K 9/0033; H05K 1/181; H05K 1/0203; H05K 2201/066; H05K 2201/09072; H05K 2201/10265; H05K 2201/10371; H05K 2201/10409; A63F 13/90
  See application file for complete search history.

(56) References Cited

U.S. PATENT DOCUMENTS

| | | | |
|---|---|---|---|
| 9,332,646 | B2 | 5/2016 | Chen |
| 2002/0044424 | A1* | 4/2002 | Hashimoto ......... H01L 21/4878 361/709 |
| 2008/0074839 | A1 | 3/2008 | Tamaki |
| 2009/0201646 | A1 | 8/2009 | Yang |
| 2014/0126161 | A1 | 5/2014 | Chen |

FOREIGN PATENT DOCUMENTS

| | | |
|---|---|---|
| JP | 2001203485 A | 7/2001 |
| JP | 2003101269 A | 4/2003 |
| JP | 2005019882 A | 1/2005 |
| JP | 2013222275 A | 10/2013 |
| JP | 2014093520 A | 5/2014 |
| WO | 2014197726 A1 | 12/2014 |

OTHER PUBLICATIONS

Office Action for corresponding JP Application No. JP2017510272, 7 pages, dated Mar. 20, 2018.
International Preliminary Report on Patentability for corresponding PCT Application No. PCT/JP2016/061034, 5 pages, dated Oct. 12, 2017.
Notification of Reasons for Refusal for corresponding JP Application No. 2018-167248, 9 pages, dated Apr. 16, 2019.

* cited by examiner

ELECTRONIC APPARATUS

TECHNICAL FIELD

The present invention relates to an electronic apparatus in which an integrated circuit is cooled utilizing a heat sink.

BACKGROUND ART

In an electronic apparatus such as a game device or a personal computer, in order to cool an integrated circuit such as a central processing unit (CPU) or a graphics processing unit (GPU), a heat sink that receives heat from the integrated circuit is sometimes utilized.

In an electronic apparatus of U.S. Patent Application Publication No. 2008/074839, an integrated circuit is mounted on a circuit board, and a heat receiving block of a heat sink is disposed on the surface of the integrated circuit. In order to prevent unnecessary radiation from the circuit board, the opposite faces of the circuit board are covered with metal plates (shields). A leaf spring is disposed at the opposite side to the heat sink with the shield and the circuit board interposed therebetween. The leaf spring is connected to the heat receiving block by a screw extending through the shields and the circuit board. The leaf spring pulls the heat receiving block toward the circuit board through the screw. Consequently, the heat receiving block is pressed against the surface of the integrated circuit, and as a result, heat can be transmitted smoothly from the integrated circuit to the heat receiving block.

SUMMARY

In U.S. Patent Application Publication No. 2008/074839, the shields that cover the circuit board have a function for preventing unnecessary radiation from the circuit board. However, since the leaf spring is positioned on the outer side of the two shields and besides held in contact with plate shields, there is the possibility that a sufficient radiation prevention effect may not be achieved.

An electronic apparatus according to the present invention includes a circuit board, an integrated circuit mounted on one of faces of the circuit board, a heat sink disposed on the surface of the integrated circuit, a first shield that covers the other face of the circuit board, a connecting member extending through a through-hole formed in the circuit board, and a biasing member disposed between the circuit board and the first shield and configured to bias the heat sink toward the one face of the circuit board through the connecting member, the biasing member being not electrically connected to the shield. According to this electronic apparatus, the integrated circuit and the heat sink can be contacted with each other with certainty by action of the biasing member. Further, the biasing member is disposed between the circuit board and the first shield and is not electrically connected to the first shield. Accordingly, generation of unnecessary radiation can be suppressed effectively.

DESCRIPTION OF EMBODIMENT

Figure 1:
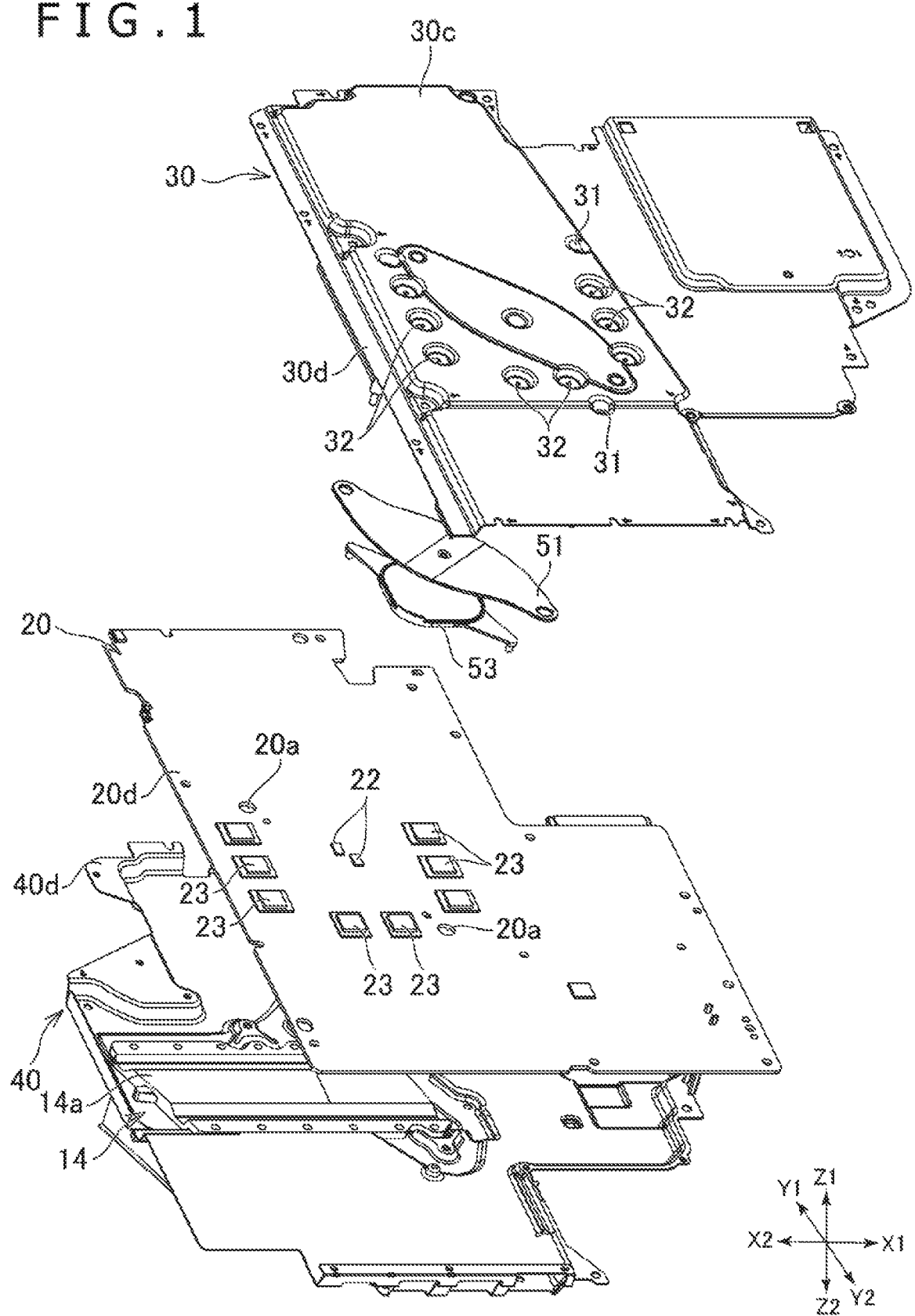
FIG. 1 is an exploded perspective view of a circuit board, an upper shield, a lower shield and so forth provided in an electronic apparatus according to an embodiment of the present invention. In this figure, the circuit board and so forth are viewed from an oblique upper side.
Figure 2:
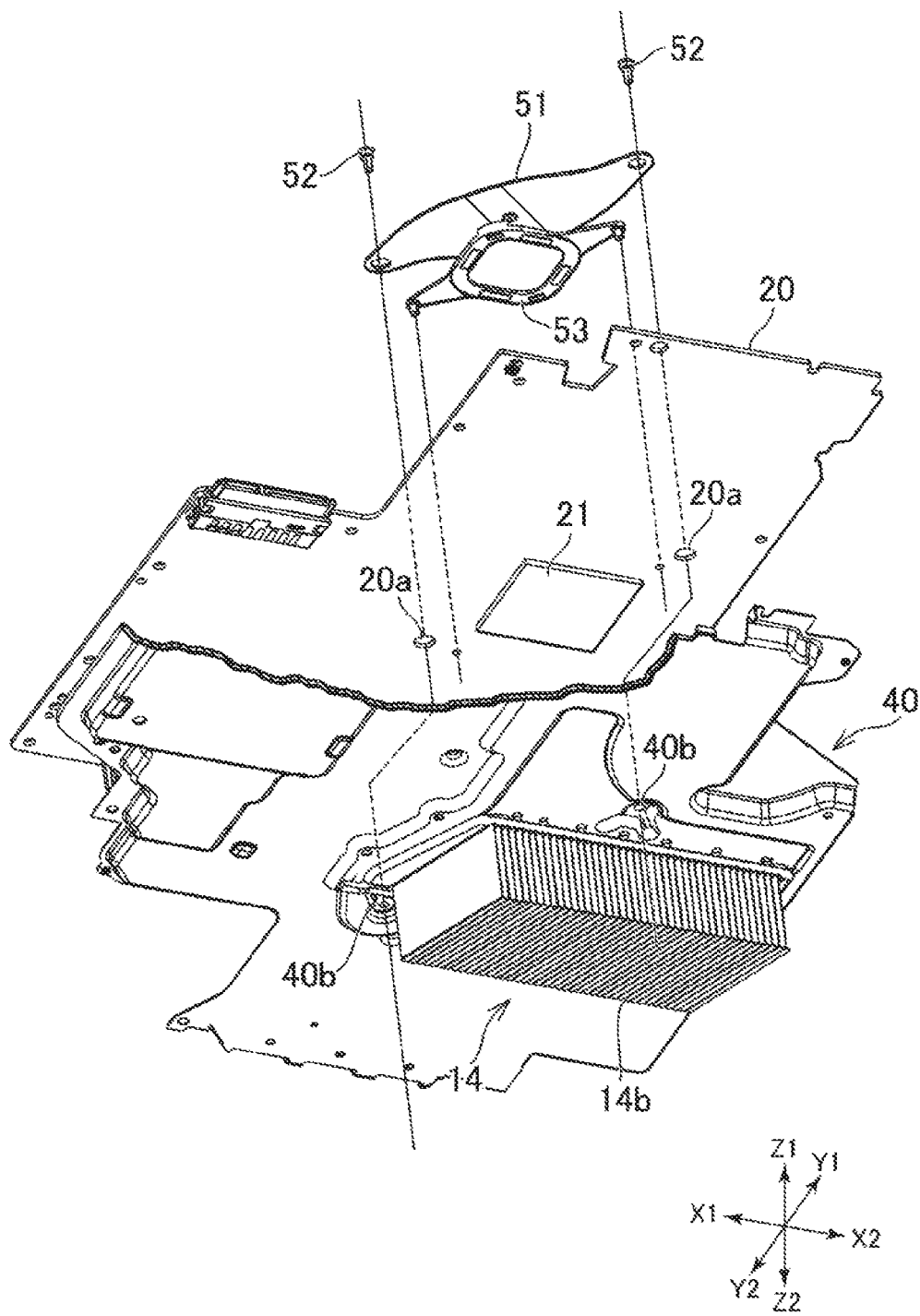
FIG. 2 is an exploded perspective view of a leaf spring, the circuit board, the lower shield and so forth. In this figure, the circuit board and so forth are viewed from an oblique lower side.
Figure 3:
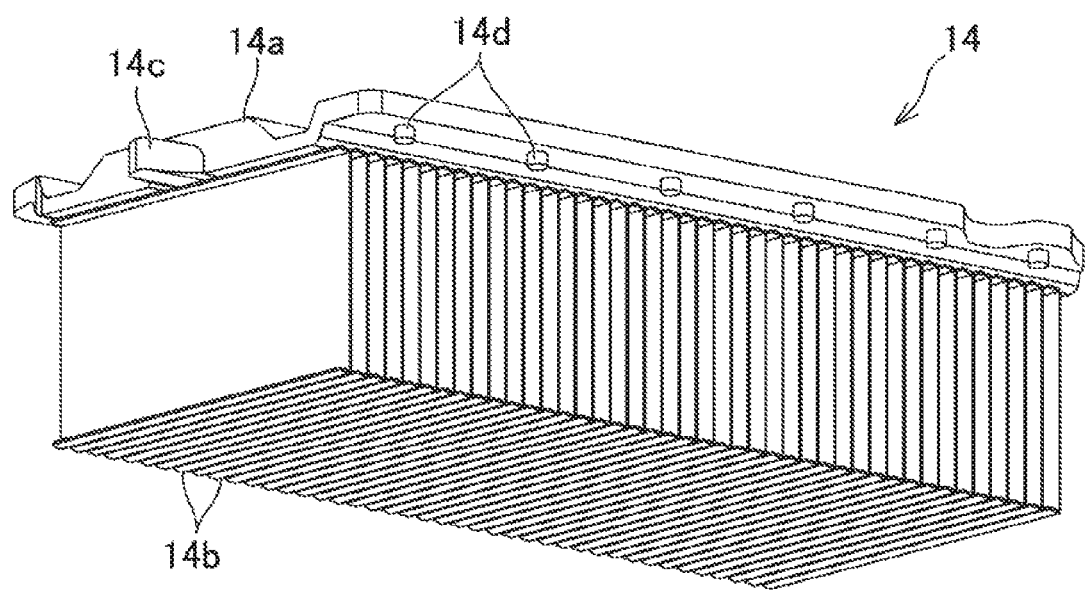
FIG. 3 is a perspective view of a heat sink.
Figure 3:
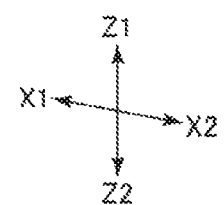
Figure 4:
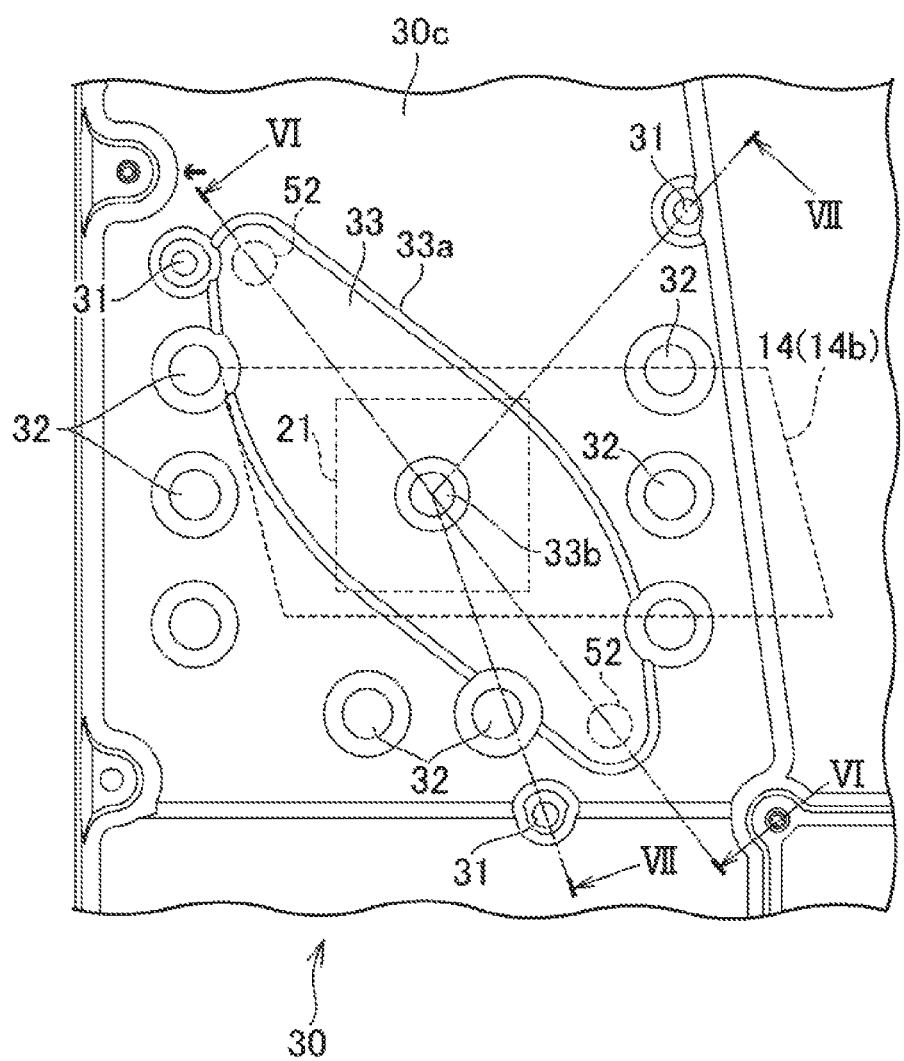
FIG. 4 is a plan view of the upper shield. In this figure, the opposite side to a face of the upper shield opposing to the circuit board is depicted.
Figure 5:
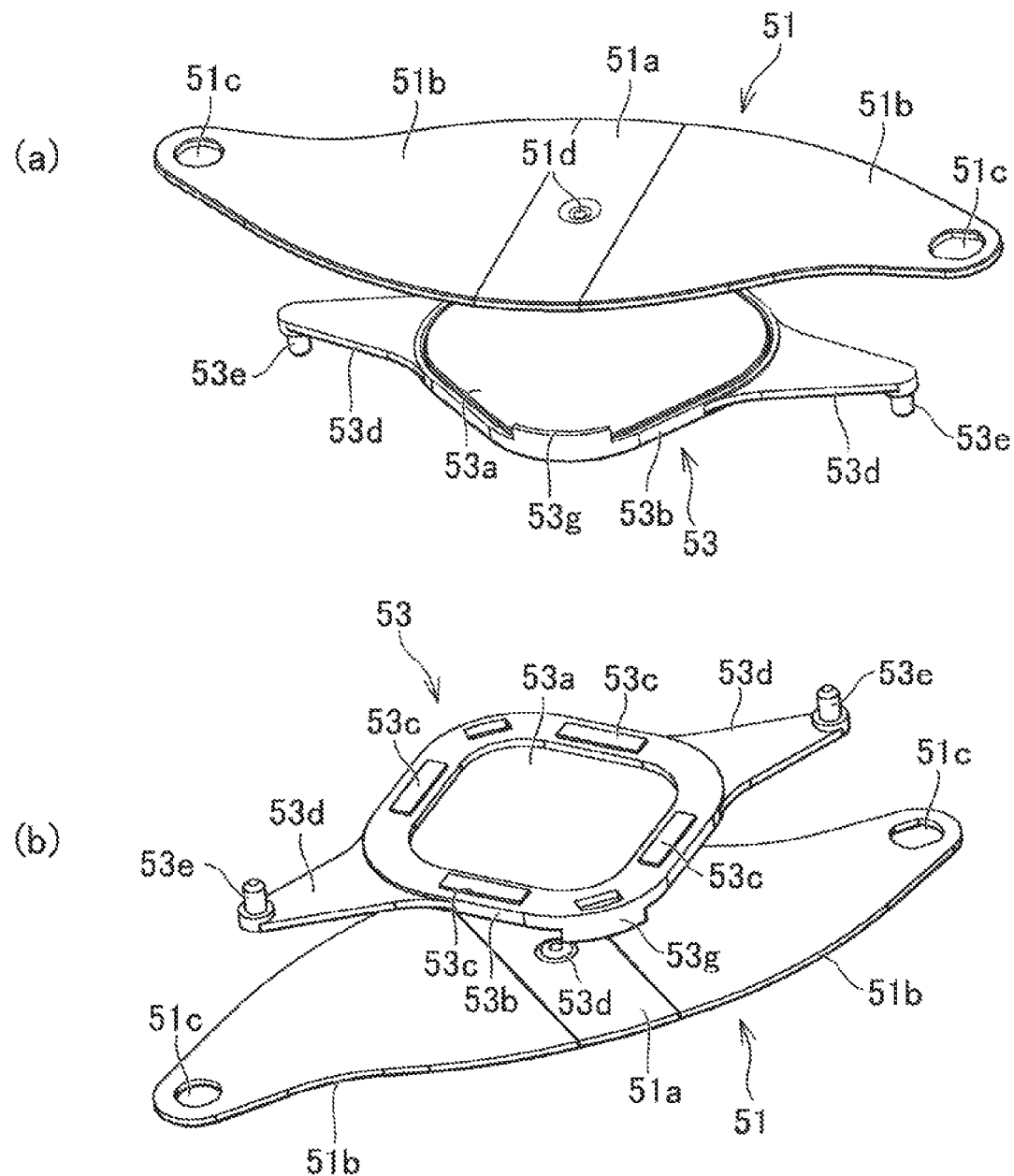
FIG. 5 is a perspective view of a spring receiving member.
Figure 6:
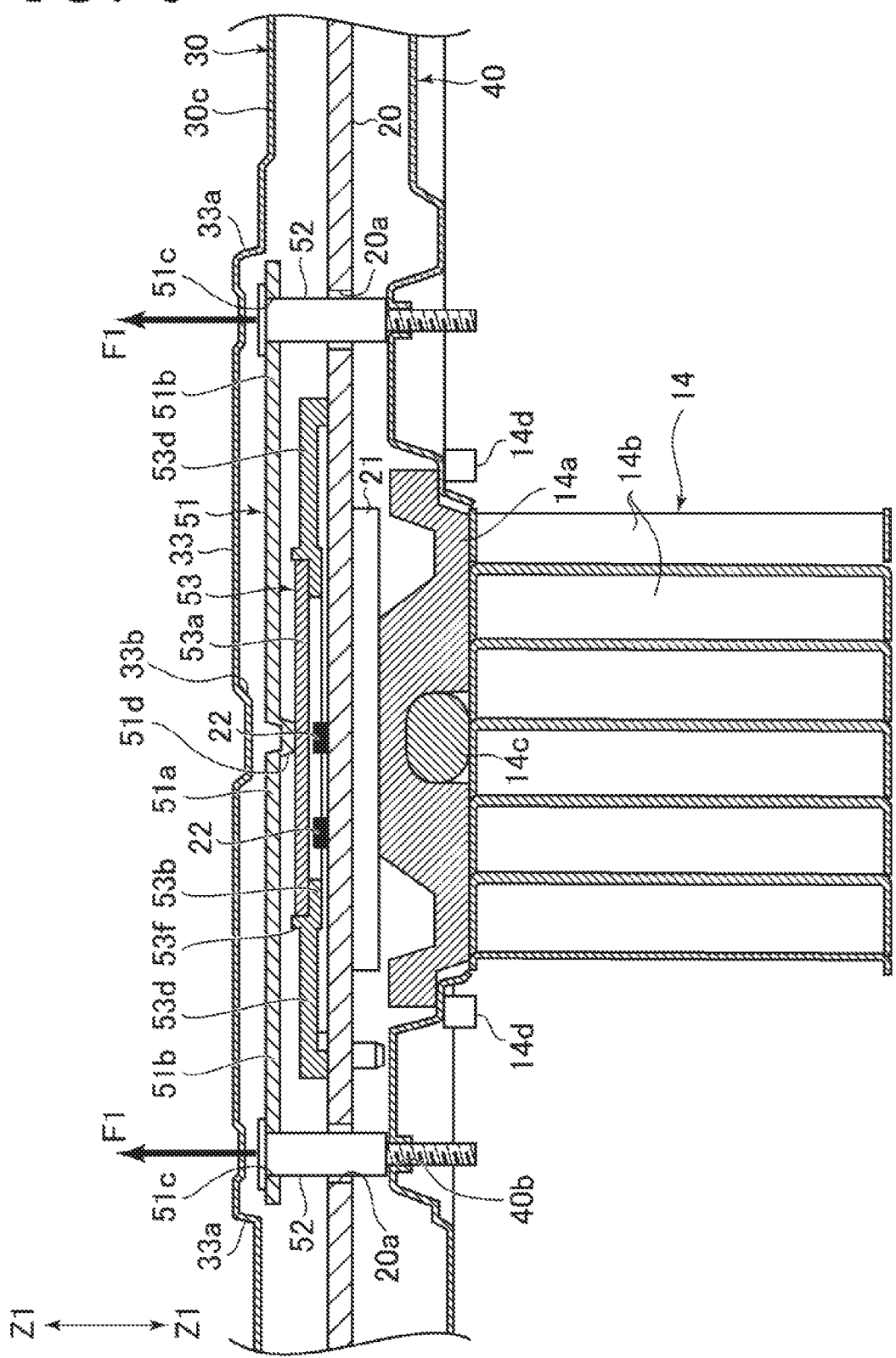
FIG. 6 is a sectional view taken along line VI-VI depicted in FIG. 4.
Figure 7:
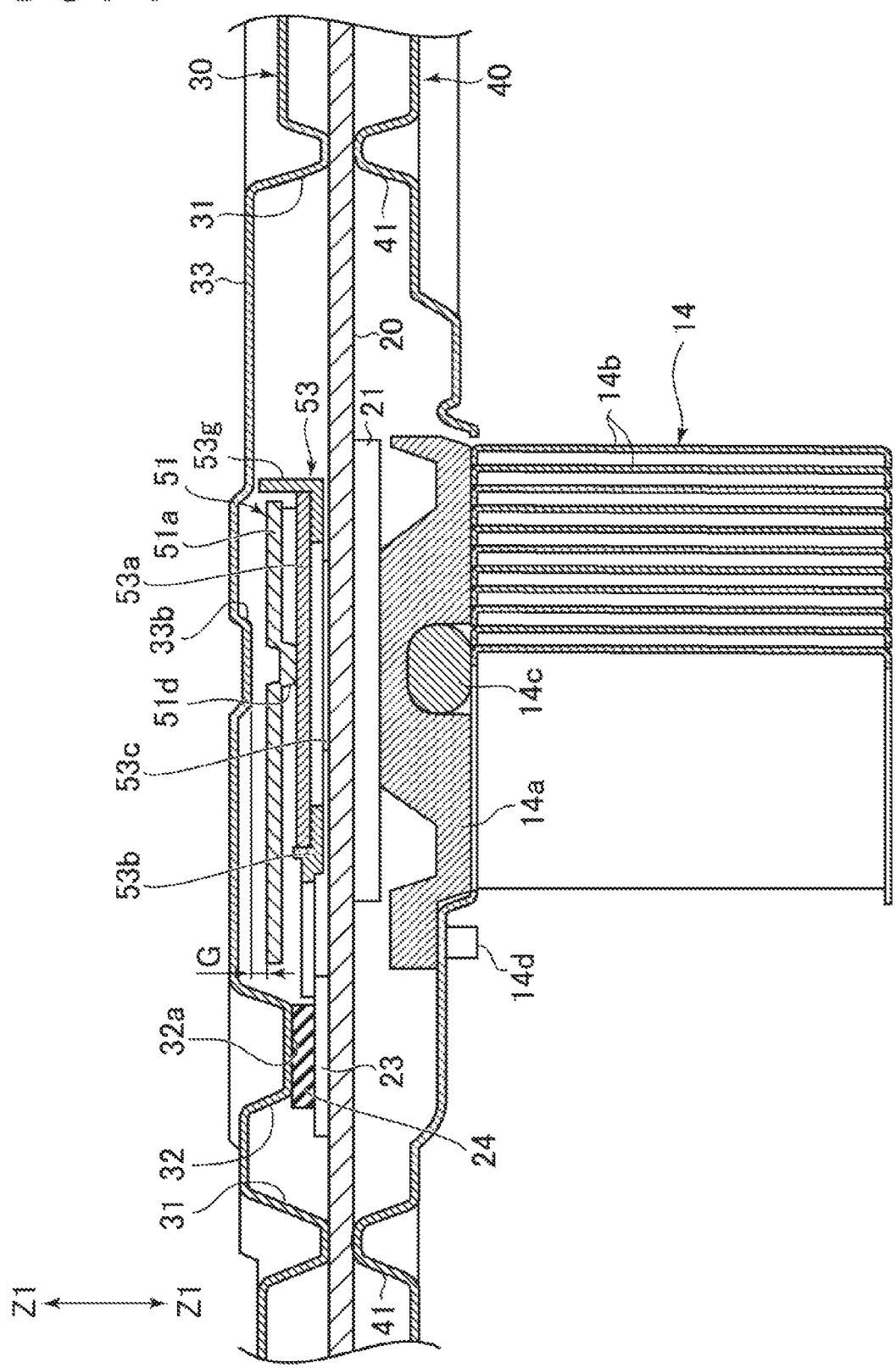
FIG. 7 is a sectional view taken along line VII-VII depicted in FIG. 4.

In the following, an embodiment of the present invention is described. FIG. 1 is an exploded perspective view of a circuit board 20, an upper shield 30 and a lower shield 40 provided in an electronic apparatus according to the embodiment of the present invention. In FIG. 1, the circuit board 20 and so forth are viewed from an oblique upper side. Further, in FIG. 1, also a leaf spring 51 and a spring receiving member 53 hereinafter described are depicted. FIG. 2 is an exploded perspective view of the circuit board 20, the lower shield 40 and so forth. In FIG. 2, the circuit board 20 and so forth are viewed from an oblique lower side, and a heat sink 14 attached to the lower shield 40 is depicted. FIG. 3 is a perspective view of the heat sink 14. FIG. 4 is a plan view of the upper shield 30. FIG. 5 is a perspective view of the leaf spring 51 and the spring receiving member 53. In FIG. 5(a), the members are viewed from an upper side, and in FIG. 5(b), the lower side of the members is viewed. FIG. 6 is a sectional view taken along line VI-VI depicted in FIG. 4. FIG. 7 is a sectional view taken along line VII-VII depicted in FIG. 4.

In the following description, Y1 and Y2 depicted in the figures represent a forward direction and a rearward direction, respectively, and X1 and X2 represent a rightward direction and a leftward direction, respectively. Further, Z1 and Z2 represent an upward direction and a downward direction, respectively.

Although the electronic apparatus according to the present invention is, for example, a game device, a personal computer, an audio-visual apparatus or the like, it may be applied to other electronic apparatus.

The electronic apparatus includes a circuit board 20 and shields 30 and 40. As depicted in FIG. 2, an integrated circuit 21 is mounted on the circuit board 20. In the example described herein, the integrated circuit 21 is mounted on a lower face of the circuit board 20. The integrated circuit 21 is, for example, a CPU that controls the entire electronic apparatus. The integrated circuit 21 may be a GPU or may be a microprocessor that has both of a function of a CPU and a function of a GPU.

Each of the shields 30 and 40 is configured from a plate member of a material having conductivity (for example, a metal). The circuit board 20 is covered with the shields 30 and 40. More particularly, the lower shield 40 covers a face of the circuit board 20 on which the integrated circuit 21 is mounted (in the example herein, the lower face), and the upper shield 30 covers a face at the opposite side to the face on which the integrated circuit 21 is mounted (in the example herein, the upper face). The shields 30 and 40 prevent unnecessary radiation from the circuit board 20

(more particularly, unnecessary radiation from electronic parts such as the integrated circuit 21). The shields 30 and 40 cover, for example, the overall area of the circuit board 20. For the purpose of avoiding interference between parts mounted on the circuit board 20 and the shields 30 and 40 and so forth, part of the circuit board 20 may be exposed from the shields 30 and 40. The shields 30 and 40 are electrically grounded. The shields 30 and 40 may contact at outer peripheral edges thereof with each other.

The shields 30 and 40 and the circuit board 20 are fixed to each other by fastening members such as screws. Outer peripheral portions 30d and 40d of the shields 30 and 40 and an outer peripheral portion 20d of the circuit board 20 have a plurality of mounting holes formed therein such that the fastening members are inserted. For example, the shields 30 and 40 and the circuit board 20 are accommodated in an exterior member that configures an outer face of the electronic apparatus and are fixed to the external member by screws. Further, the shields 30 and 40 and the circuit board 20 may be fixed to a frame, which configures the electronic apparatus, by fastening members such as screws and covered with the exterior member.

As depicted in FIG. 6, the heat sink 14 is disposed at the lower side of the circuit board 20. The heat sink 14 is held in contact with the surface of the integrated circuit 21. In particular, the heat sink 14 has a heat receiving block 14a in the form of a plate, and a plurality of fins 14b provided on one face of the heat receiving block 14a and juxtaposed in a spaced relationship from each other (refer to FIG. 3). The fins 14b may be attached to the heat receiving block 14a by soldering or the like or may be molded integrally with the heat receiving block 14a. The heat receiving block 14a is held in contact at the other face thereof with the surface of the integrated circuit 21. As depicted in FIG. 6, the heat receiving block 14a has a heat transmission member 14c provided thereon, which is a bar formed from a heat pipe or a material having a high thermal conductivity.

As depicted in FIGS. 1 and 2, the electronic apparatus includes a biasing member disposed between the circuit board 20 and the upper shield 30 for biasing the heat sink 14 toward the circuit board 20. In the present embodiment, the electronic apparatus has a leaf spring 51 as the biasing member. A space is formed between the circuit board 20 and the upper shield 30, and the leaf spring 51 is disposed in this space. The leaf spring 51 is positioned at the opposite side to the integrated circuit 21 and the heat sink 14 with the circuit board 20 interposed therebetween and is covered with the upper shield 30. Through-holes 20a are formed in the circuit board 20, and connecting members 52 extend through the through-holes 20a. Although each connecting member 52 is, for example, a screw, it may be a bolt. The leaf spring 51 biases the heat sink 14 toward the circuit board 20 through the connecting members 52. That is, the leaf spring 51 pulls the heat sink 14 toward the integrated circuit 21 through the connecting members 52 (in FIG. 6, the force of the leaf spring 51 is indicated by an arrow mark F1). Consequently, the heat receiving block 14a of the heat sink 14 and the integrated circuit 21 can be held in contact with each other with certainty. The connecting members 52 may be connected to the heat sink 14 or may be attached to the lower shield 40 and indirectly connected to the heat sink 14 as hereinafter described. The biasing member is not necessarily limited to the leaf spring 51. For example, if the space between the circuit board 20 and the upper shield 30 is comparatively great in the thicknesswise direction of the circuit board 20, a coil spring may be utilized as the basing member described above.

As described hereinabove, the leaf spring 51 is covered with the upper shield 30. The leaf spring 51 is not electrically connected to the upper shield 30. By this, radiation from the leaf spring 51 can be suppressed from going out to the outside, and then generation of unnecessary radiation from the electronic apparatus can be suppressed effectively. As depicted in FIG. 6, in an example, a clearance is provided between the leaf spring 51 and the upper shield 30 such that the leaf spring 51 does not electrically connect to the upper shield 30. As another example, an insulator may be disposed between the leaf spring 51 and the upper shield 30 such that the leaf spring 51 does not electrically connect to the upper shield 30. The leaf spring 51 and the connecting members 52 are formed from a material having conductivity (particularly, a metal). In other words, two members having conductivity are configured so as not to electrically connect to each other. As a form that utilizes an insulator, for example, a sheet formed from an insulating material is attached to one of the leaf spring 51 and the upper shield 30. Where an insulating sheet is attached to the leaf spring 51, the sheet may be attached over the overall area of the leaf spring 51 or may be attached only to part of the leaf spring 51. Where an insulating sheet is attached to the upper shield 30, the sheet may be attached over the overall area of a portion of the upper shield 30 corresponding to the leaf spring 51 or may be attached only to a partial region of the portion corresponding to the leaf spring 51.

As depicted in FIG. 2, in the example herein, the heat sink 14 is attached to the lower shield 40, and the connecting members 52 are attached to the lower shield 40. Accordingly, the leaf spring 51 pulls the heat sink 14 through the lower shield 40. With this structure, the necessity to provide the heat sink 14 with locations for attaching the connecting members 52 is eliminated. As a result, the degree of freedom in shape of the heat sink 14 can be increased. The structure for connecting the leaf spring 51 and the heat sink 14 to each other is not limited to this. For example, the connecting members 52 may be attached directly to the heat receiving block 14a of the heat sink 14. In particular, a screw hole for attaching each connecting member 52 may be provided in the heat receiving block 14a.

As depicted in FIG. 6, the electronic apparatus has two connecting members 52 positioned at the opposite sides to each other with the integrated circuit 21 interposed therebetween. The two connecting members 52 are positioned on the opposite sides to each other with the heat sink 14 interposed therebetween. The leaf spring 51 biases the heat sink 14 toward the circuit board 20 through the two connecting members 52. Consequently, the contact force of the heat receiving block 14a can act uniformly on the surface of the integrated circuit 21.

As depicted in FIG. 5, the leaf spring 51 has a base portion 51a, and two spring portions 51b extending to the opposite sides to each other from the base portion 51a. The two spring portions 51b can be elastically deformed in a thicknesswise direction of the circuit board 20 in a state in which the base portion 51a is fixed. The two connecting members 52 are attached to end portions of the two spring portions 51b. In particular, for example, a hole 51c is formed at an end portion of each spring portion 51b, and a connecting member 52 is fitted in the hole 51c from the upper side. Each connecting member 52 is caught at a base portion thereof by an edge of the hole 51c (refer to FIG. 6). In the example depicted in FIG. 5, each spring portion 51b becomes gradually thinner toward a tip thereof. The shape of the spring portion 51b is not limited to the example depicted in FIG. 5 and may be changed suitably.

As depicted in FIG. 6, an opening of a size corresponding to that of the plurality of fins 14b is formed in the lower shield 40. The fins 14b are fitted in the opening of the lower shield 40 from the upper side, and the heat receiving block 14a is caught at an outer peripheral portion thereof by the upper side of an edge of the opening. A plurality of projections 14d for fixing the position of the heat receiving block 14a on the lower shield 40 may be formed on an outer peripheral portion of the heat receiving block 14a (refer to FIG. 3). The projections 14d are fitted in holes formed on an edge of the opening of the lower shield 40.

As depicted in FIG. 6, the lower shield 40 has two attaching portions (particularly, screw holes) 40b positioned at the opposite sides to each other the heat sink 14 interposed therebetween. The two connecting members 52 are attached at end portions (screws) thereof to the two attaching portions 40b. As depicted in FIG. 4, the two connecting members 52 (two attaching portions 40b) are positioned on a straight line inclined with respect a direction perpendicular to the four edges of the integrated circuit 21 (in FIG. 4, a straight line indicating the cross section of FIG. 6). In other words, the two connecting members 52 (two attaching portions 40b) are provided at the opposite sides to each other on the diagonal lines of the integrated circuit 21.

As depicted in FIG. 6, the spring receiving member 53 is provided on the circuit board 20. The spring receiving member 53 is positioned between the circuit board 20 and the base portion 51a of the leaf spring 51 and has a receiving portion 53a (refer to FIG. 5) that supports the base portion 51a of the leaf spring 51 thereon. The receiving portion 53a has a form of a plate, and the base portion 51a of the leaf spring 51 is disposed on the receiving portion 53a. As depicted in FIG. 5, a projection 51d may be formed at the base portion 51a such that the projection 51d projects toward the receiving portion 53a. By forming this projection 51d, the contact position between the base portion 51a and the receiving portion 53a can be specified.

The spring receiving member 53 includes a supporting portion 53b that is disposed on the circuit board 20 and supports the receiving portion 53a thereon. A protrusion 53f (refer to FIG. 6) is preferably formed on an outer peripheral edge of the supporting portion 53b such that the protrusion 53f surrounds an outer peripheral edge of the receiving portion 53a. The position of the receiving portion 53a on the supporting portion 53b can be fixed thereby. Such a protrusion 53f may not necessarily be formed.

The supporting portion 53b is preferably formed from an insulating material. By this, short-circuiting of wiring lines formed on the circuit board 20 can be prevented with certainty. The supporting portion 53b is molded, for example, from a resin (for example, plastic). The receiving portion 53a is preferably formed from a material having rigidity higher than that of the supporting portion 53b. For example, the receiving portion 53a is formed from a metal. The structure of the spring receiving member 53 is not limited to that described above. For example, also the receiving portion 53a may be formed from a resin. In addition, the entire of the spring receiving member 53 may be molded integrally from a resin.

The circuit board 20 has electronic parts 22 mounted on the opposite side to the integrated circuit 21 with the circuit board 20 interposed therebetween (refer to FIG. 1). As depicted in FIG. 6, the receiving portion 53a of the spring receiving member 53 is positioned between the electronic parts 22 and the base portion 51a of the leaf spring 51. The supporting portion 53b of the spring receiving member 53 is formed avoiding the positions of the electronic parts 22 and supports the receiving portion 53a. Consequently, the force of the leaf spring 51 can be suppressed from acting upon the electronic parts 22. As depicted in FIG. 5(b), in the example of the spring receiving member 53, the supporting portion 53b has a form of a frame having an opening on the inner side thereof and supports an outer edge of the receiving portion 53a. The electronic parts 22 are positioned at the inner side of the supporting portion 53b. The thickness of the supporting portion 53b is greater than the height of the electronic parts 22.

Although the supporting portion 53b and the receiving portion 53a have, for example, a quadrangular shape as depicted in FIG. 5, the shape of them is not limited to a quadrangular shape. Where the electronic parts 22 are not mounted on the opposite side to the integrated circuit 21, the supporting portion 53b may not have the opening formed therein.

As depicted in FIG. 5(b), a plurality of protrusions 53c may be formed on a lower face of the supporting portion 53b (face contacting with the circuit board 20). By utilizing the protrusions 53c, the position at which the supporting portion 53b contacts with the circuit board 20 can be specified. Further, a clearance is secured between the supporting portion 53b and the circuit board 20 by the protrusions 53c. As a result, heat of the electronic parts 22 can be suppressed from staying at the inner side of the supporting portion 53b. The plurality of protrusions 53c are preferably disposed uniformly over an overall area of the supporting portion 53b. For example, four protrusions 53c are individually disposed on the four sides of the supporting portion 53b.

As depicted in FIG. 5, the supporting portion 53b of the spring receiving member 53 has two extensions 53d extending in the opposite directions to each other. At an end portion of each extension 53d, a protrusion 53e is formed such that the protrusion 53e is inserted into a hole formed in the circuit board 20. Consequently, the position of the spring receiving member 53 on the circuit board 20 is defined. The spring receiving member 53 is attached to the circuit board 20 such that the spring receiving member 53 receives elastic force of the leaf spring 51 from the base portion 51a of the leaf spring 51. The protrusions 53e are not necessarily formed on the spring receiving member 53.

As depicted in FIG. 5(a) and FIG. 7, a spacer portion 53g is formed on the spring receiving member 53 such that the spacer portion 53g projects toward the upper shield 30. The tip of the spacer portion 53g is positioned rather near to the upper shield 30 exceeding the position of the leaf spring 51 in the thicknesswise direction of the circuit board 20. The distance between the tip of the spacer portion 53g and the upper shield 30 is smaller than the distance between the leaf spring 51 and the upper shield 30. By the configuration just described, even when the upper shield 30 is deflected or force that pushes the upper side of the upper shield 30 acts upon the upper shield 30, the distance between the upper shield 30 and the circuit board 20 can be secured by the spacer portion 53g. As a result, contact between the upper shield 30 and the leaf spring 51 can be prevented. In one example, in a normal state (state in which the upper shield 30 is not deflected), the tip of the spacer portion 53g does not contact with the upper shield 30. Where the spacer portion 53g is formed from an insulating material, the spacer portion 53g may contact with the upper shield 30. In the description here, the "distance between the leaf spring 51 and the upper shield 30" is a distance between them at a position at which the distance between the leaf spring 51 and the upper shield 30 is smallest. In the example herein, a protrusion 33b is formed on the upper shield 30 as depicted in FIG. 7.

Accordingly, in the description here, the "distance between the leaf spring 51 and the upper shield 30" is a distance G between the tip of the protrusion 33b and the surface of the leaf spring 51. The protrusion 33b may not necessarily be formed on the upper shield 30.

The spacer portion 53g is molded integrally with the supporting portion 53b formed from an insulating material. By this, even if force pushing the upper shield 30 acts upon this and the upper shield 30 is contacted with the spacer portion 53g, the receiving portion 53a can maintain the state in which it is electrically isolated from the upper shield 30. As a result, even if, in a form in which the receiving portion 53a is formed from a conductive material, force pushing the upper shield 30 acts upon this, the leaf spring 51 and the upper shield 30 can be prevented from electrically connecting to each other. The spacer portion 53g is formed along an outer peripheral edge of the receiving portion 53a. Consequently, the position of the receiving portion 53a is also defined by the spacer portion 53g. In an example, the supporting portion 53b has two spacer portions 53g positioned on the opposite sides to each other with the center of the receiving portion 53a interposed therebetween. The base portion 51a of the leaf spring 51 is disposed between the two spacer portions 53g.

As depicted in FIGS. 4 and 7, spacer portions 31 are formed on the upper shield 30 such that the spacer portions 31 project toward the circuit board 20. The tip of each spacer portion 31 is positioned rather near to the circuit board 20 exceeding the position of the leaf spring 51 in the thicknesswise direction of the circuit board 20. The distance between the tip of the spacer portion 31 and the surface of the circuit board 20 (face at the leaf spring 51 side) is smaller than the distance between the leaf spring 51 and the upper shield 30. By the configuration, even if the upper shield 30 is deflected or force pushing the upper side of the upper shield 30 acts upon this, the distance between the upper shield 30 and the circuit board 20 can be secured by the spacer portions 31, and as a result, contact between the upper shield 30 and the leaf spring 51 can be prevented. In the description here, the "distance between the leaf spring 51 and the upper shield 30" is a distance between them at a position at which the distance between the leaf spring 51 and the upper shield 30 is smallest similarly as described hereinabove.

In one example, in a normal state (in a state in which force does not act upon the upper shield 30), the tip of the spacer portions 31 does not contact with the circuit board 20. By the configuration just described, some load can be suppressed from being applied from the tip of the spacer portions 31 to the circuit board 20 arising from the tolerance between the upper shield 30 and the circuit board 20. The tip of the spacer portions 31 may be in contact with the circuit board 20. The spacer portions 31 are preferably provided at positions at which no electronic part exists on the circuit board 20.

The upper shield 30 is formed from a plate member of a metal. The spacer portions 31 are formed by depressing the upper side of the upper shield 30 at the positions of the spacer portions 31 by punching. As depicted in FIG. 4, the upper shield 30 preferably has a plurality of spacer portions 31. The plurality of spacer portions 31 are disposed so as to surround the leaf spring 51. In the example herein, the upper shield 30 has three spacer portions 31. The three spacer portions 31 are disposed in a spaced relationship from each other in a circumferential direction around the center of the leaf spring 51. The number of spacer portions 31 is not limited to three but may be two or more than three.

As depicted in FIG. 7, the lower shield 40 may have protrusions 41 at positions corresponding to the spacer portions 31 of the upper shield 30 such that the protrusions 41 project toward the circuit board 20. The protrusions 41 are opposed to the spacer portions 31 with the circuit board 20 interposed therebetween. By the configuration just described, even if the spacer portions 31 hit upon the circuit board 20, the force then can be received by the protrusions 41 of the lower shield 40. As a result, the circuit board 20 can be suppressed from being deflected.

As depicted in FIG. 7, the upper shield 30 has spacer portions 32 formed thereon such that the spacer portions 32 project toward the circuit board 20. The tip of the each spacer portion 32 is positioned rather near to the circuit board 20 exceeding the position of the leaf spring 51 in the thicknesswise direction of the circuit board 20. In the example herein, the circuit board 20 has a plurality of electronic parts 23 on a face thereof at the opposite side to the face on which the integrated circuit 21 is mounted. The plurality of electronic parts 23 are disposed so as to surround the position of the integrated circuit 21. The electronic part 23 is, for example, an integrated circuit (for example, an auxiliary CPU or memory). The electronic parts 23 may not necessarily be integrated circuits. The spacer portions 32 project toward the electronic parts 23. A cushion 24 is disposed between a spacer portion 32 and an electronic part 23. The cushion 24 is formed from an elastic body such as, for example, rubber. The tip of the spacer portion 32 abuts with the cushion 24. By this configuration, even when the upper shield 30 is deflected or force pushing the upper side of the upper shield 30 acts upon this, the distance between the upper shield 30 and the circuit board 20 can be secured, and contact between the upper shield 30 and the leaf spring 51 can be prevented. The cushion 24 is preferably formed from rubber having thermal conductivity. By this configuration, heat of the electronic part 23 can be transmitted to the upper shield 30 through the cushion 24, and as a result, the electronic parts 23 can be cooled.

As depicted in FIG. 7, each spacer portion 32 has, at the tip thereof, a flat face 32a having an area greater than that of the tip of the spacer portions 31 described hereinabove. According to this configuration, even if the spacer portions 32 abut with the electronic parts 23, excessive force can be suppressed from acting upon the electronic parts 23.

As depicted in FIG. 6, the upper shield 30 has a plurality of spacer portions 32. The plurality of spacer portions 32 individually correspond to the positions of the plurality of the electronic parts 23 mounted on the circuit board 20. The plurality of spacer portions 32 are disposed so as to surround the leaf spring 51. In the example herein, the upper shield 30 has eight spacer portions 32.

As depicted in FIG. 1, the upper shield 30 has a portion 33 (hereinafter referred to as spring facing portion) that covers the leaf spring 51. The spring facing portion 33 is swollen in a direction in which it is spaced from the leaf spring 51 with respect to a portion 30c around the spring facing portion 33, in the example herein, is swollen upwardly (refer to FIG. 6). According to the configuration just described, it is facilitated to secure a clearance between the leaf spring 51 and the upper shield 30.

In one example, the spring facing portion 33 has a size corresponding to the leaf spring 51 and besides has a shape corresponding to the leaf spring 51. The spring facing portion 33 is formed a little greater than the leaf spring 51. As depicted in FIG. 6, a step is formed on an outer peripheral edge 33a of the spring facing portion 33 (boundary between the spring facing portion 33 and the portion 30c around the same). This step surrounds the overall periphery of the leaf spring 51. Where the outer peripheral edge 33a of the spring facing portion 33 surrounds the leaf spring 51 in a plan view, the shape of the spring facing portion 33 may not necessarily correspond to the leaf spring 51.

As depicted in FIGS. 2 and 7, the spring facing portion 33 may have the protrusion 33b formed thereon such that the protrusion 33b projects toward the base portion 51a of the leaf spring 51. In this case, a clearance is provided also between the protrusion 33b and the base portion 51a. By providing such a protrusion 33b as just described, for example, when force pushing the upper shield 30 acts upon this, the force can be suppressed from acting in a concentrated manner upon part of the circuit board 20.

Figure 8:
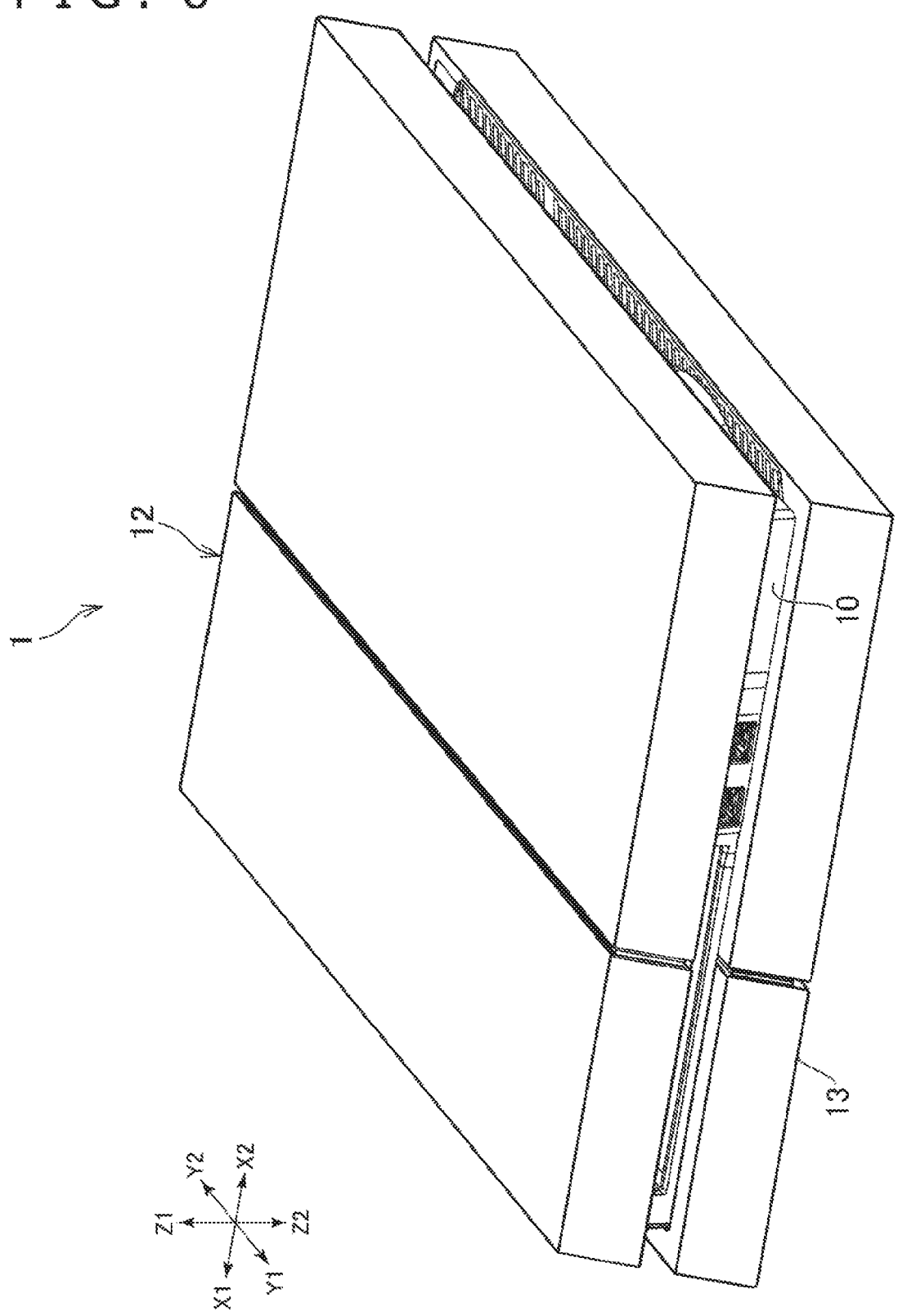
FIG. 8 is a perspective view of the electronic apparatus according to the embodiment of the present invention.

FIG. 8 is a perspective view depicting an example of the electronic apparatus according to the present invention. The electronic apparatus 1 depicted in FIG. 8 has a main body 10, an upper cover 12 that configures part of an outer face of the electronic apparatus 1 and besides covers the upper side of the main body 10, and a lower cover 13 that configures part of the outer face of the electronic apparatus 1 and covers the lower side of the main body 10. The circuit board 20, the upper shield 30 and the lower shield 40 described above are provided on the main body 10. The electronic apparatus 1 is, for example, a game device.

As described above, in the electronic apparatus according to the present embodiment, the leaf spring 51 (biasing member) biases the heat sink 14 toward one face of the circuit board 20 (face on which the integrated circuit 21 is mounted) through the connecting members 52. Consequently, the heat sink 14 and the integrated circuit 21 can be contacted with each other with certainty. Further, the leaf spring 51 is positioned between the circuit board 20 and the upper shield 30 and is disposed such that the leaf spring 51 does not electrically connect to the upper shield 30. Consequently, radiation from the leaf spring 51 can be suppressed from going out to the outside.

The present invention is not limited to the embodiment described hereinabove, and various alterations may be made. For example, where the connecting members 52 are attached directly to the heat sink 14, the lower shield 40 may not necessarily be provided on the electronic apparatus.

Further, as a location for preventing, when force that pushes the upper shield 30 acts upon this, the upper shield 30 and the leaf spring 51 from contacting with each other, the spacer portion of the spring receiving member 53 and the spacer portions 31 and 32 formed on the upper shield 30 are provided. A dedicated part may be provided for securing the distance between the circuit board 20 and the upper shield 30.

The invention claimed is:

1. An electronic apparatus, comprising:
a circuit board having first and second opposing surfaces;
an integrated circuit mounted on the second surface of the circuit board;
a heat sink disposed on a surface of the integrated circuit;
a first shield that covers the first surface of the circuit board, and that inhibits radiation therethrough;
a second shield that covers the second surface of the circuit board, and that inhibits radiation therethrough;
a connecting member configured to extend through a through-hole formed in the circuit board; and
a biasing member disposed in a space between the circuit board and the first shield and configured to bias the heat sink toward the second surface of the circuit board through the connecting member, wherein:

the circuit board is connected to the second shield via the biasing member and the connecting member,
one of the circuit board and the second shield has a spacer portion provided thereon so as to project toward the other one of the circuit board and the second shield, and
an end portion of the spacer portion is positioned rather near to the other one of the circuit board and the second shield exceeding a position of the biasing member in a thickness-wise direction of the circuit board.

2. The electronic apparatus according to claim 1, wherein a clearance is secured between the biasing member and the first shield.

3. The electronic apparatus according to claim 1, wherein the spacer portion is formed integrally with the one of the circuit board and the second shield or is attached to the one of the circuit board and the second shield.

4. The electronic apparatus according to claim 3, wherein
the circuit board has a spring receiving member attached thereto, which is positioned between the circuit board and the biasing member and has a receiving portion that supports the biasing member thereon, and
the spacer portion is formed on the spring receiving member.

5. The electronic apparatus according to claim 4, wherein
the spring receiving member includes a supporting portion disposed on the circuit board and having the receiving portion supported thereon, and
the supporting portion is formed from an insulating material.

6. The electronic apparatus according to claim 5, wherein the spacer portion is formed on the supporting portion.

7. The electronic apparatus according to claim 5, wherein the receiving portion is formed from a material having rigidity higher than that of the supporting portion.

8. The electronic apparatus according to claim 1, wherein
the circuit board has an electronic part on the first surface thereof, and
the electronic apparatus comprises a spring receiving member that includes a receiving portion positioned between the electronic part of the circuit board and the biasing member in a thickness-wise direction of the circuit board and having the biasing member supported thereon, and a supporting portion disposed on the circuit board and having the receiving portion supported thereon, the supporting portion avoiding a position of the electronic part.

9. The electronic apparatus according to claim 3, wherein the spacer portion is a protrusion formed on the second shield and projecting toward the circuit board.

10. The electronic apparatus according to claim 1, wherein
at least two spacer portions are provided on one of the circuit board and the second shield, and
the at least two spacer portions are positioned at the opposite sides to each other with the biasing member interposed there between as viewed in plan.

11. An electronic apparatus, comprising:
a circuit board having first and second opposing surfaces;
an electronic part mounted on the first surface of the circuit board;
an integrated circuit mounted on the second surface of the circuit board;
a heat sink disposed on a surface of the integrated circuit;
a shield that covers the first surface of the circuit board;
a connecting member configured to extend through a through-hole formed in the circuit board;

a biasing member disposed between the circuit board and the shield and configured to bias the heat sink toward the second surface of the circuit board through the connecting member;

a spring receiving member that includes a receiving portion having the biasing member supported thereon; and a supporting portion disposed on the circuit board and having the receiving portion supported thereon.

12. The electronic apparatus of claim 11, wherein the supporting portion is located on the first surface of the circuit board opposite to the integrated circuit.

13. The electronic apparatus of claim 11, wherein the receiving portion is located within an area defined by a periphery of the integrated circuit.

* * * * *